(12) United States Patent
Lin et al.

(10) Patent No.: US 8,729,572 B2
(45) Date of Patent: May 20, 2014

(54) LIGHT EMITTING DIODE PACKAGE HAVING A VOLTAGE STABILIZING MODULE CONSISTING OF TWO DOPING LAYERS

(75) Inventors: Hou-Te Lin, Hsinchu (TW); Chao-Hsiung Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 42 days.

(21) Appl. No.: 13/533,981

(22) Filed: Jun. 27, 2012

(65) Prior Publication Data
US 2013/0009178 A1    Jan. 10, 2013

(30) Foreign Application Priority Data

Jul. 8, 2011   (CN) .......................... 2011 1 0190981

(51) Int. Cl.
*H01L 29/18*    (2006.01)
*H01L 33/00*    (2010.01)

(52) U.S. Cl.
USPC ................... 257/88; 257/79; 257/80; 257/81; 257/82; 257/83; 257/84; 257/89; 257/90; 257/91; 257/92; 257/93; 257/96; 257/97; 257/98; 257/99; 257/100; 257/104; 257/105; 257/106; 257/199; 257/E25.028; 257/E27.12; 257/E27.121; 257/E27.119; 257/E31.099; 257/E31.105; 257/E31.108

(58) Field of Classification Search
USPC ........... 257/79–84, 88–93, 96–100, 104–106, 257/E27.12, E27.121, E27.119, E31.099, 257/E31.105, E31.108, E25.028, 199; 362/555, 612
See application file for complete search history.

(56) References Cited

U.S. PATENT DOCUMENTS

| | | |
|---|---|---|
| 2010/0078668 A1 | 4/2010 | Kim |
| 2010/0320483 A1* | 12/2010 | Kadotani et al. ................. 257/88 |
| 2011/0031513 A1 | 2/2011 | Hsieh et al. |
| 2011/0115055 A1* | 5/2011 | Niide et al. .................... 257/603 |

FOREIGN PATENT DOCUMENTS

| | | |
|---|---|---|
| TW | 200929595 A | 7/2009 |
| TW | 201017937 A | 5/2010 |

* cited by examiner

*Primary Examiner* — Anthony Ho
*Assistant Examiner* — David Chen
(74) *Attorney, Agent, or Firm* — Novak Druce Connolly Bove + Quigg LLP

(57) ABSTRACT

A light emitting diode package includes an electrically insulated base, first and second electrodes, an LED chip, a voltage stabilizing module, and an encapsulative layer. The base has a first surface and an opposite second surface. The first and second electrodes are formed on the first surface of the base. The LED chip is electrically connected to the first and second electrodes. The voltage stabilizing module is formed on the first surface of the base, positioned between and electrically connected to the first and second electrodes. The voltage stabilizing module connects to the LED chip in reverse parallel and has a polarity arranged opposite to that of the LED chip. The voltage stabilizing module has an annular shape and encircles the first electrode. The encapsulative layer is formed on the base and covers the LED chip.

11 Claims, 3 Drawing Sheets

LIGHT EMITTING DIODE PACKAGE HAVING A VOLTAGE STABILIZING MODULE CONSISTING OF TWO DOPING LAYERS

BACKGROUND

1. Technical Field

The present disclosure relates to semiconductor devices and, more particularly, to a light emitting diode (LED) package and a method for manufacturing the LED.

2. Description of Related Art

LEDs have many beneficial characteristics, including low electrical power consumption, low heat generation, long lifetime, small volume, good impact resistance, fast response and excellent stability. These characteristics have enabled the LEDs to be widely used as a light source in electrical appliances and electronic devices.

The LEDs are one-way conducting elements. If current flows through the LEDs in a forward direction, the LEDs emit light. If current flows through the LEDs in a reverse direction, the LEDs fail to emit light. In addition, the LEDs would be broken down if the reverse current is too large. There is unpredictable current, such that caused by static electricity, which may flow through the LEDs in the reverse direction during the operation of the LEDs. A voltage stabilizing diode such as a Zener diode, is therefore applied to the LEDs for preventing the LEDs from damage by such unpredictable current in the reverse direction. A typical design of the Zener diode is reverse parallel connecting the Zener diode with the LEDs via wires and positioning the Zener diode outside of the package of the LEDs. The reverse parallel connection means that the Zener diode is connected in parallel with LEDs while the Zener diode is reverse biased and the LEDs are forward biased. Such design has some deficiencies. For example, such a connection way results in a complicated structure, and a large volume of the LEDs. More importantly, such a connection way may not obtain a stable electrical connection between the Zener diode and the LEDs after the LEDs having been use for a certain time.

What is needed is an LED package and a method for manufacturing the LED package which can overcome the problem of the prior art.

DETAILED DESCRIPTION

Figure 1:
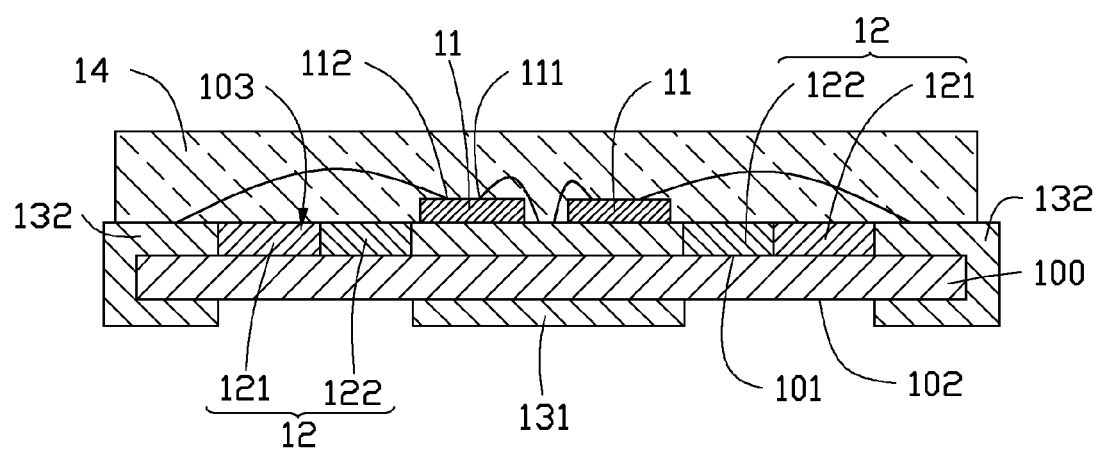
FIG. 1 is a section view of an LED package in accordance with an exemplary embodiment of the present disclosure.
Figure 2:
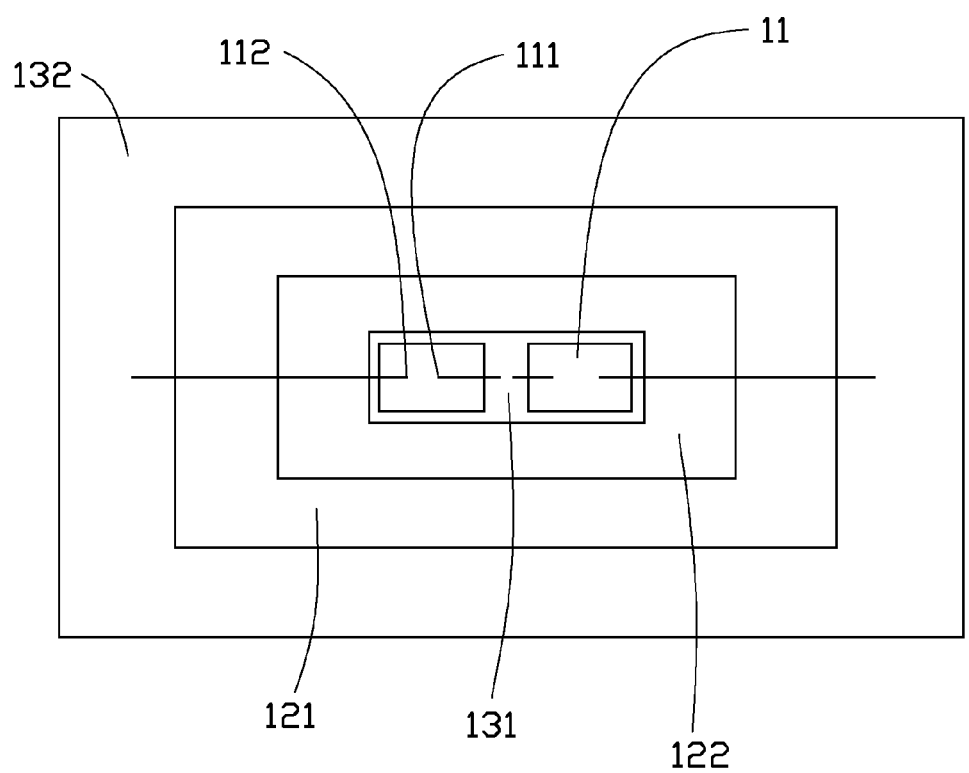
FIG. 2 is a top view of the LED package in accordance with the exemplary embodiment of the present disclosure.

Referring to FIGS. 1 and 2, a light emitting diode (LED) package in accordance with an exemplary embodiment of the present disclosure comprises an electrically insulated base 100, two LED chips 11, a voltage stabilizing module 12, a first electrode 131, a second electrode 132, and an encapsulative layer 14. The voltage stabilizing module 12 is formed on the base 100 and electrically connects to the first and second electrodes 131, 132. The LED chips 11 are mounted on the first electrode 131 and electrically connect to the first and second electrodes 131, 132. When the first and second electrodes 131, 132 electrically connect to a power source (not shown), the LED chips 11 have forward current flowing therethrough and emit light. The voltage stabilizing module 12 has a polarity arranged opposite to that of each of the LED chips 11. Thus, the irregular current or static electricity, if there is any during the operation of the LED chips 11, can be discharged by the voltage stabilizing module 12, and the LED chips 11 are prevented from damage. In the preferred embodiment, the first electrode 131 is connected to the positive pole of the power source, while the second electrode 132 is connected to the negative pole of the power source, whereby the forward current can flow through the LED chips 11 to cause the LED chips 11 to emit light.

Specifically, the base 100 has a first surface 101 and a second surface 102 opposite to the first surface 101. A protrusion 103 extends upwardly and annularly from the first surface 101. The protrusion 103 can be formed by patternizing the first surface 101 via microlithography and etching. The base 100 may be made of the following one or more than one of the materials: Si, GaAs, ZnO and InP.

The voltage stabilizing module 12 can be formed by doping the protrusion 103 of the base 100 to convert the protrusion 103 into the voltage stabilizing module 12. The doping can by any type such as epitaxial dope, diffusing dope or ion-implantation. It is understood that the voltage stabilizing module 12 can be formed on the surface of the protrusion 103. The voltage stabilizing module 12 comprises a first doping layer 121 and a second doping layer 122. The first doping layer 121 is located beside the second doping layer 122. The first doping layer 121 and the second doping layer 122 have an identical thickness, and are in the same level. The first doping layer 121 is a P-type doping layer, and the second doping layer 122 is an N-type doping layer.

The first electrode 131 is positioned on a center portion of the first surface 101 of the base 100. The first electrode 131 has a rectangular shape. The first electrode 131 is encircled by the voltage stabilizing module 12. Specifically, the second doping layer 122 encircles and is attached to the first electrode 131, and the first doping layer 121 encircles and is attached to the second doping layer 122. The second electrode 132 encircles and is attached to the first doping layer 121. The voltage stabilizing module 12 is such configured to electrically connect the first and second electrodes 131, 132, whereby when connecting with the power source, the LED chips 11 emit light, and the voltage stabilizing module 12 discharges the irregular current or static electricity. The second electrode 132 is formed on the first surface 101 of the base 100 and bends and extends to the second surface 102 of the base 100. The first electrode 131 can also penetrate through the base 100 and extend to the second surface 102 of the base 100; thus, the LED package can be formed as a surface mounting device.

Each of the LED chips 11 has two poles, i.e., anode pole 111 and cathode pole 112. The poles 111, 112 are electrically connected to the first and second electrodes 131, 132 respectively via metal wires (not labeled). The LED chips 11 can be only one, or can be more than two in an alternative embodiment. When connecting with the power source, the current of the power source is flown through the LED chips 11 for emitting light, while the irregular current or static electricity can be discharged by the voltage stabilizing module 12.

The encapsulative layer 14 is made of transparent or translucent materials. The encapsulative layer 14 is formed on the base 100 and encapsulates the LED chips 11. Phosphors can be contained in the encapsulative layer 14.

Compared with the conventional package structure, the LED package of the present disclosure provides the voltage stabilizing module 12 in an annular shape and in a position between the first and second electrodes 131, 132, the thickness and indeed the volume of the LED package is therefore decreased. Simultaneously, the annular voltage stabilizing module 12 positioned between the first and second electrodes 131, 132 ensures a stable connection therebetween; thus, the object of preventing the LED package from breaking down such as via static electricity is achieved. Furthermore, the LED package in accordance with the present disclosure is more durable and reliable.

Furthermore, the LED package can be formed as a surface mounting device thanks to the base 100 being formed of nonconductive materials, i.e., being insulated, and there is no need to form an insulating material on the base 100.

Figure 3:
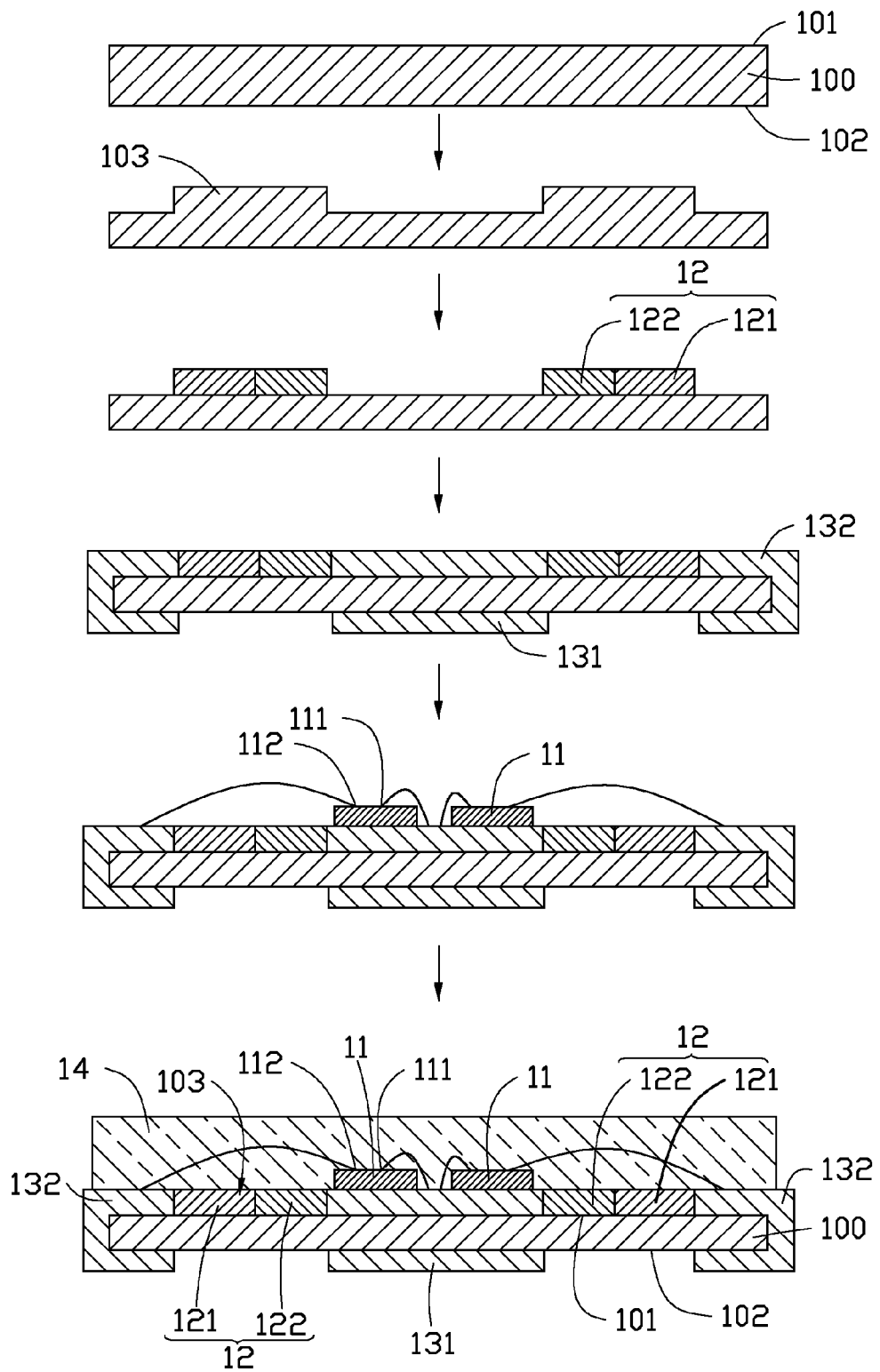
FIG. 3 shows a plurality of structures being made according to a flow chart of a method of manufacturing the LED package in accordance with the exemplary embodiment of the present disclosure.

A method of manufacturing the LED package of the present disclosure now will be described in detail hereinafter with reference to FIG. 3.

First, an electrically insulated base 100 is provided. The base 100 may be made of the following one or more than one of the materials: Si, GaAs, ZnO and InP. The base 100 has a first surface 101 and a second surface 102 opposite to the first surface 101. A protrusion 103 is extended upwardly and annularly from the first surface 101 by patternizing the first surface 101 via etching or microlithography.

Second, a first doping layer 121 and a second doping layer 122 are formed in the protrusion 103 by doping the protrusion 103 with two different elements or two types of different elements. An annular voltage stabilizing module 12 is thus formed and in the shape of the protrusion 103. The type of doping can be epitaxial doping or iron implantation. The first doping layer 121 is a P-type doping layer, and the second doping layer 122 is an N-type doping layer. The first doping layer 121 and the second doping layer 122 are arranged side by side. The first and second doping layers 121, 122 are positioned in a same level and have an identical thickness.

Third, a first electrode 131 is formed on a center portion of the first surface 101 of the base 100. The first electrode 131 is encircled by and attached to the second doping layer 122 of the voltage stabilizing module 12. The first electrode 131 penetrates through the base 100 and extends to the second surface 102 of the base 100. A second electrode 132 is formed on a periphery portion of the first surface 101 of the base 100. The second electrode 132 encircles and is attached to the first doping layer 121 of the voltage stabilizing module 12. The second electrode 132 bends and extends to the second surface 102 of the base 100. The first electrode 131 and the second electrode 132 are electrically insulated from each other on the second surface 102 of the base 100.

Fourth, two LED chips 11 are mounted on the first electrode 131. The LED chips 11 are electrically connected to the first and second electrodes 131, 132 via wire bonding. The voltage stabilizing module 12 connects to the LED chips 11 in reverse parallel. The voltage stabilizing module 12 has a polarity opposite to that of the LED chips 11; that is, when connecting a power source to the LED package, the anode of the power source connects to the anode pole 111 of the LED chip 11 via the first electrode 131, which connects with a P-type semiconductor layer of the LED chip 11, while the anode of the power source connects to the second doping layer 122 of the voltage stabilizing module 12 via the first electrode 131, which is an N-type doping layer (i.e., an N-type semiconductor layer).

At last, an encapsulative layer 14 is formed on the base 100 and covers the LED chips 11. The encapsulative layer 14 is made of transparent or translucent materials. Phosphors can be contained in the encapsulative layer 14.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED (light emitting diode) package comprising:
an electrically insulated base, the base having a first surface and a second surface opposite to the first surface;
a first electrode formed on the first surface of the base;
a second electrode formed on the first surface of the base;
at least one LED chip formed on the first electrode and electrically connected to the first and second electrodes;
a voltage stabilizing module formed on the first surface of the base, the voltage stabilizing module being positioned between and electrically connected to the first and the second electrodes, the voltage stabilizing module connecting to the at least one LED chip in reverse parallel and having a polarity arranged opposite to that of the at least one LED chip, and the voltage stabilizing module having an annular shape and encircling the first electrode; and
an encapsulative layer formed on the base and covering the at least one LED chip;
wherein the voltage stabilizing module comprises a first doping layer and a second doping layer attached to the first doping layer, the second doping layer being attached to and encircling the first electrode.

2. The LED package of claim 1, wherein the first and second doping layers are in the same level and have an identical thickness.

3. The LED package of claim 1, wherein the second electrode is attached to and encircles the first doping layer.

4. The LED package of claim 1, wherein the second electrode bends and extends to the second surface of the base.

5. The LED package of claim 4, wherein the first electrode penetrates through and extends to the second surface of the base, the first and second electrodes are electrically insulated from each other on the second surface of the base.

6. The LED package of claim 1, wherein an annular protrusion is formed on the first surface of the base, and the voltage stabilizing module is formed by the protrusion.

7. The LED package of claim 1, wherein the base is made of the following one or more than one of the materials: Si, GaAs, ZnO and InP.

8. An LED (light emitting diode) package comprising:
an electrically insulated base, the base having a first surface and a second surface opposite to the first surface;
a first electrode formed on the first surface of the base;
a second electrode formed on the first surface of the base;
at least one LED chip formed on the first electrode and electrically connected to the first and second electrodes;
a voltage stabilizing module formed on the first surface of the base, the voltage stabilizing module being positioned between and electrically connected to the first and the second electrodes, the voltage stabilizing module connecting to the at least one LED chip in reverse parallel and having a polarity arranged opposite to that of the at least one LED chip, and the voltage stabilizing module having an annular shape and encircling the first electrode; and
an encapsulative layer formed on the base and covering the at least one LED chip;
wherein the second electrode bends and extends to the second surface of the base.

9. The LED package of claim 8, wherein the first electrode penetrates through and extends to the second surface of the base, the first and second electrodes are electrically insulated from each other on the second surface of the base.

10. The LED package of claim 8, wherein an annular protrusion is formed on the first surface of the base, and the voltage stabilizing module is formed by the protrusion.

11. The LED package of claim 8, wherein the base is made of the following one or more than one of the materials: Si, GaAs, ZnO and InP.

* * * * *